(12) United States Patent
Thakur et al.

(10) Patent No.: US 12,592,688 B2
(45) Date of Patent: Mar. 31, 2026

(54) SIGNAL TRANSMISSION THROUGH LONG DELAY LINES

(71) Applicant: NXP USA, Inc., Austin, TX (US)

(72) Inventors: Krishna Thakur, Gautam Budh Nagar (IN); Deependra Kumar Jain, Noida (IN); Devesh Pratap Singh, Bijnor (IN); Akshay Thakur, Austin, TX (US)

(73) Assignee: NXP USA, Inc., Austin, TX (US)

( * ) Notice: Subject to any disclaimer, the term of this patent is extended or adjusted under 35 U.S.C. 154(b) by 88 days.

(21) Appl. No.: 18/428,584

(22) Filed: Jan. 31, 2024

(65) Prior Publication Data

US 2024/0413815 A1      Dec. 12, 2024

(30) Foreign Application Priority Data

Jun. 9, 2023    (IN) .............................. 202311039667

(51) Int. Cl.
*H03K 5/133* (2014.01)
*H03K 5/135* (2006.01)
*H03K 5/00* (2006.01)

(52) U.S. Cl.
CPC ............. *H03K 5/133* (2013.01); *H03K 5/135* (2013.01); *H03K 2005/00058* (2013.01)

(58) Field of Classification Search
CPC ................... H03K 5/133; H03K 5/135; H03K 2005/00058; H03K 5/06; H03K 5/14; H03K 5/04; H03K 3/017; H03K 5/1565; H03K 5/159; H03K 7/08; H03K 2005/00013; H03K 2005/0015; H03K 2005/00078; H03K 2005/00019
See application file for complete search history.

(56) References Cited

U.S. PATENT DOCUMENTS

| | | | |
|---|---|---|---|
| 8,451,043 B2 | 5/2013 | Baumann et al. | |
| 9,257,977 B1 | 2/2016 | Chang | |
| 2003/0025564 A1* | 2/2003 | Franca-Neto | H03L 7/23 |
| | | | 331/100 |
| 2003/0184512 A1* | 10/2003 | Hayashi | G11C 19/28 |
| | | | 345/100 |

OTHER PUBLICATIONS

Choo, et al., "A 0.02mm2 Fully Synthesizable Period-Jitter Sensor Using Stochastic TDC Without Reference Clock and Calibration in 10nm CMOS Technology," ISSCC 2018, Session 7, Neuromorphic, Clocking and Security Circuits, 7.2, Feb. 13, 2018, Samsung Electronics, Hwaseong, Korea, pp. 1-3.

* cited by examiner

*Primary Examiner* — Jung Kim
(74) *Attorney, Agent, or Firm* — Joanna G. Geld

(57) ABSTRACT

Systems and methods for transmitting signals through long delay lines are discussed. In some embodiments, a delay line may include: (i) a first delay element comprising: a first input terminal, a first output terminal, and a first reset terminal; and (ii) a second delay element comprising: a second input terminal coupled to the first output terminal, and a second output terminal coupled to the first reset terminal. In other embodiments, a method may include coupling an input terminal of a delay element to an output terminal of a preceding delay element, and coupling an output terminal of the delay element to a reset terminal of the preceding delay element.

18 Claims, 5 Drawing Sheets

500

SIGNAL TRANSMISSION THROUGH LONG DELAY LINES

CROSS-REFERENCE TO RELATED APPLICATIONS

This application claims the priority under 35 U.S.C. § 119 of India application No. 202311039667, filed on 9 Jun. 2023, the contents of which are incorporated by reference herein.

FIELD

This disclosure relates generally to electronic circuits, and more specifically, to systems and methods for transmitting signals through long delay lines.

BACKGROUND

A delay line is an electronic circuit configured specifically to delay a signal. A delay line typically includes a plurality of delay elements coupled in series, such that each element applies a small amount of time delay to its input signal before passing its output signal to the next element. The total delay provided by a delay line is equal to the sum of the delays provided by each of its individual elements.

The inventors hereof have determined that, in addition to providing its intended time delay, each element in a delay line also causes some amount of duty cycle degradation to the input signal. Particularly in the case of very long delay lines, the accumulation of duty cycle degradation caused by each element can ultimately reduce the pulse width of the input signal as it propagates, until propagation eventually ceases.

BRIEF DESCRIPTION OF THE DRAWINGS

The present invention(s) are illustrated by way of example and are not limited by the accompanying figures, in which like references indicate similar elements. Elements in the figures are illustrated for simplicity and clarity and have not necessarily been drawn to scale.

DETAILED DESCRIPTION

An Integrated Circuit (IC) is a set of electronic circuits fabricated on a piece of semiconductor material (e.g., silicon). In modern semiconductor manufacturing, an ever-increasing number of miniaturized transistors and other electronic components can be integrated into a single electronic package or chip.

For example, a System-on-Chip (SoC) is a type of IC that includes most or all components of an entire computer or other electronic system. Typical SoC components include one or more Central Processing Units (CPUs), Graphics Processing Units (GPUs), memory interfaces, Input/Output (I/O) devices, radios, I/O interfaces, secondary storage interfaces, etc.

Figures 1, 2:
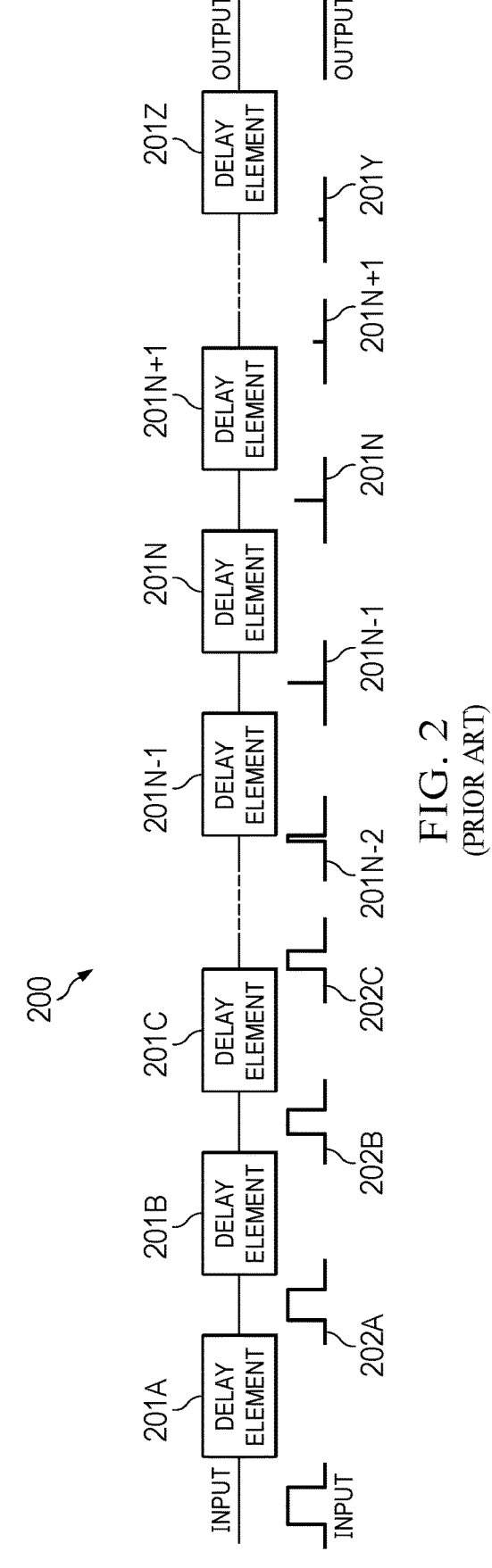
FIG. 1 is a diagram of an example of a System-on-Chip (SoC), according to some embodiments.
FIG. 2 is a diagram of an example of a conventional delay line ("Prior Art").

FIG. 1 is a diagram of an example of SoC 100. As shown, SoC 100 includes first circuit 102 and second circuit 103 coupled to each other via delay line 101. Although only two circuits and one delay line are shown for simplicity of illustration, real-world SoCs may include dozens (or hundreds) of circuits and multiple delay lines.

In this case, first circuit 102 may include a clock generation circuit (e.g., a reference clock, a clock source, etc.), or the like. Meanwhile, second circuit 103 may include a processor core (e.g., a CPU), or the like. In operation, first circuit 102 produces a clock signal and provides it to second circuit 103 via delay line 101.

As used herein, the term "clock signal" refers to a signal that oscillates between high and low states at a constant frequency, and is therefore usable to synchronize the operations of various circuits.

Delay line 101 may be designed to add a time delay to a clock signal received from first circuit 102 before the delayed clock signal is provided to second circuit 103. As such, delay line 101 has many possible uses, for example, in clocking and time-to-digital conversion applications.

Delay line 101 includes a series of individual delay elements, cells, or stages, and each element propagates electrical pulses by buffering them. Ideally, each element in delay line 101 would pass each pulse received at its input terminal with its original duty cycle to its output terminal.

In practice, however, process, voltage, and temperature (PVT) variations and parasitic effects invariably cause some amount of duty cycle degradation, reducing the width of the pulse at the output of the delay element. Even a small amount of duty cycle degradation by each delay element can accumulate down the entire delay line 101 until propagation eventually ceases.

To address these, and other concerns, systems and methods for transmitting signals through long delay lines are provided. In various embodiments, each delay element within delay line 101 may be reset by the output signal of a subsequent delay element, thus ensuring that a minimum pulse width gets propagated between each individual element until it reaches second circuit 103.

In certain implementations, delay line 101 may include 50 delay elements or more. Additionally, or alternatively, delay line 101 may include 100 elements or more. Additionally, or alternatively, delay line 101 may include 200 elements or more.

In various embodiments, SoC 100 may be fabricated on a wafer or die using any of many IC process technologies. For example, SoC 100 may be integrated in a substrate or die manufactured from various semiconductor materials, such as Silicon (Si), Germanium (Ge), or Gallium arsenide (GaAs), using various technologies such as complementary metal-oxide semiconductor (CMOS), silicon on insulator (SOI), double-diffused metal-oxide semiconductor (DMOS), laterally diffused metal-oxide semiconductor (LD-MOS), bipolar CMOS/DMOS (BCD), pseudomorphic high-electron-mobility transistor (pHEMT), enhancement/depletion mode (E/D-mode) pHEMT, etc.

In some deployments, SoC 100 may be part of a larger digital logic system fabricated on a single chip. The single chip may be created using a single IC fabrication process or using multiple IC fabrication processes in combination.

For example, a digital logic chip containing SoC 100 may be integrated in a substrate or die manufactured from various semiconductor materials. Different subsystems may each be fabricated using a unique IC material or process, or set of IC materials and processes. Within a larger digital system, SoC 100 may be fabricated using one set of IC materials and processes, and another subsystem may be fabricated using a different set of IC materials and processes.

FIG. 2 is a diagram of an example of conventional delay line 200 ("Prior Art"). Conventional delay line 200 includes a plurality of delay elements 201A-Z coupled in series, each element having an input terminal (left) and an output terminal (right). The output of a given delay element (e.g., element N–1) is coupled to the input terminal of an immediately subsequent delay element (e.g., element N), in a cascaded fashion.

As shown, an INPUT signal (e.g., a clock signal) with a given pulse width is received at the input terminal of first delay element 201A and transferred to subsequent delay elements, as signals 202A-Y, until last delay element 201Z produces an OUTPUT signal. In the case of a long delay line (e.g., 50, 100, or 200 or more elements), the pulse widths of signals 202A-Y become progressively smaller until propagation stops, before any pulse can reach delay element 201Z. As such, the OUTPUT of delay line 101 is zero.

Figure 3:
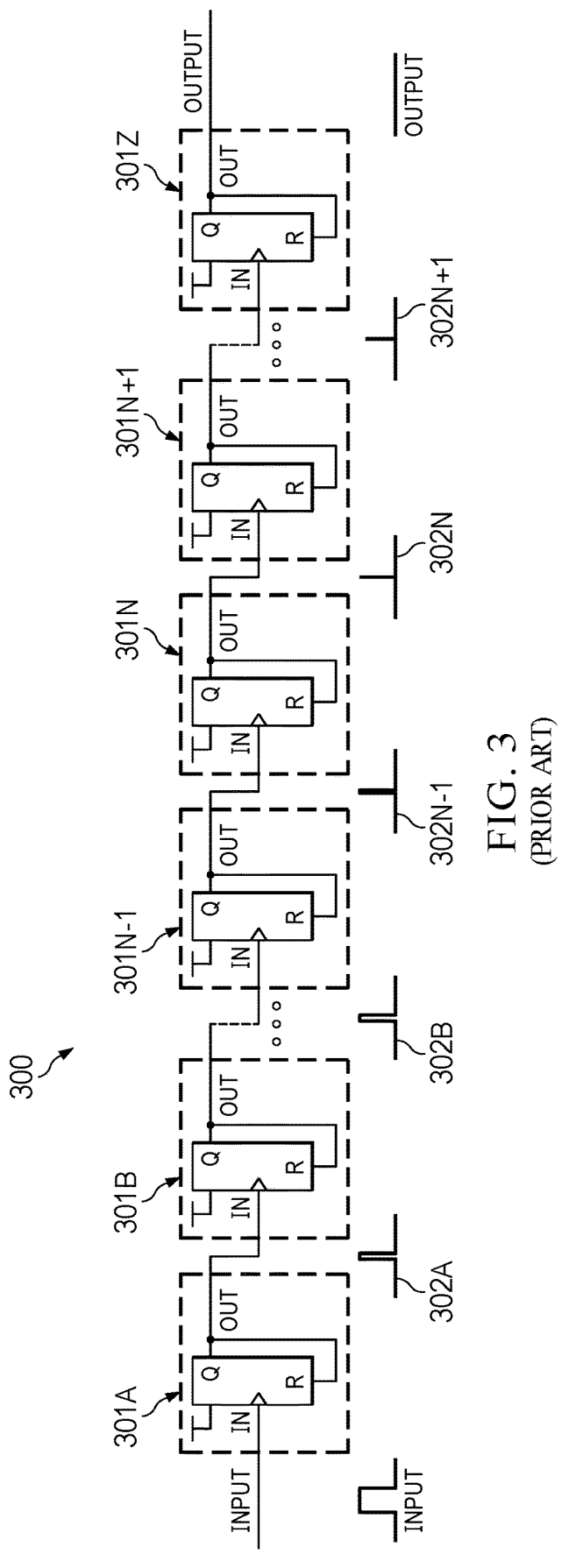
FIG. 3 is a diagram of an example of a flip-flop implementation of a conventional delay line ("Prior Art").

FIG. 3 shows an example of flip-flop implementation 300 of conventional delay line 200 using delay ("D") flip-flops ("D flip-flops") as delay elements 301A-Z. As shown, each of flip-flops 301A-Z includes an input terminal ("in"), an output terminal ("Q"), and a reset terminal ("R"). In other cases, however a complementary output ("Q̄") of delay elements 301A-Z may be used.

In implementation 300, the output terminal of each delay element (e.g., 301N) is coupled to the reset terminal of that same element (e.g., 301N). Each delay element provides sharp rise and fall edges. Due to parasitic effects, however, the pulse transfer to its next stage is marred, as thin pulses are not capable of charging the internal, parasitic capacitances of the flip-flop fast enough.

Furthermore, as the desired delay becomes larger, the degradation worsens. Again, the pulse widths of signals 302A-Y become progressively smaller until propagation stops and the OUTPUT of delay line 300 is zero.

Figure 4:
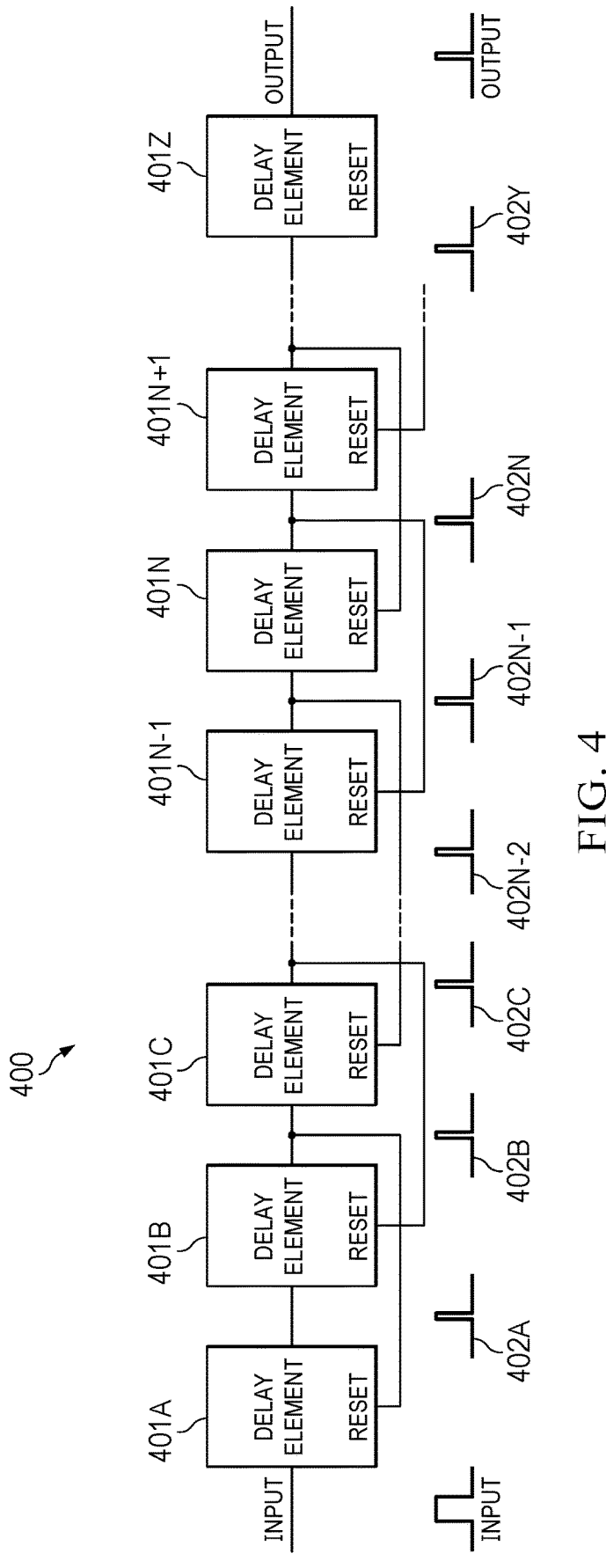
FIG. 4 is a diagram of an example of a sustainable delay line, according to some embodiments.

In contrast with the foregoing, FIG. 4 is a diagram of an example of sustainable delay line 400, according to some embodiments. In sustainable delay line 400, the output terminal of each delay element 401A-Z (e.g., 401N) is coupled to the reset terminal of its preceding delay element (e.g., 401N-1) to ensure that the pulse transition 402A-Y from a current stage to the next is completed before the current stage is reset.

Specifically, to ensure pulse transition from one stage to the next, a feedback circuit is provided to determine whether the edge transfer is complete. Only in response to receiving confirmation from a next stage (that the pulse has been transferred) is the output of the current stage switched to zero.

Each delay element has a reset terminal, and its output does not toggle to zero until that reset terminal is at a logic high. This ensures that the edge of the input signal is always transferred irrespective of PVT variations and parasitics, because a minimum pulse width is always maintained at all nodes along sustainable delay line 400.

Last delay element 401Z may not have a reset terminal (or its reset terminal may remain uncoupled to any other delay element).

Figure 5:
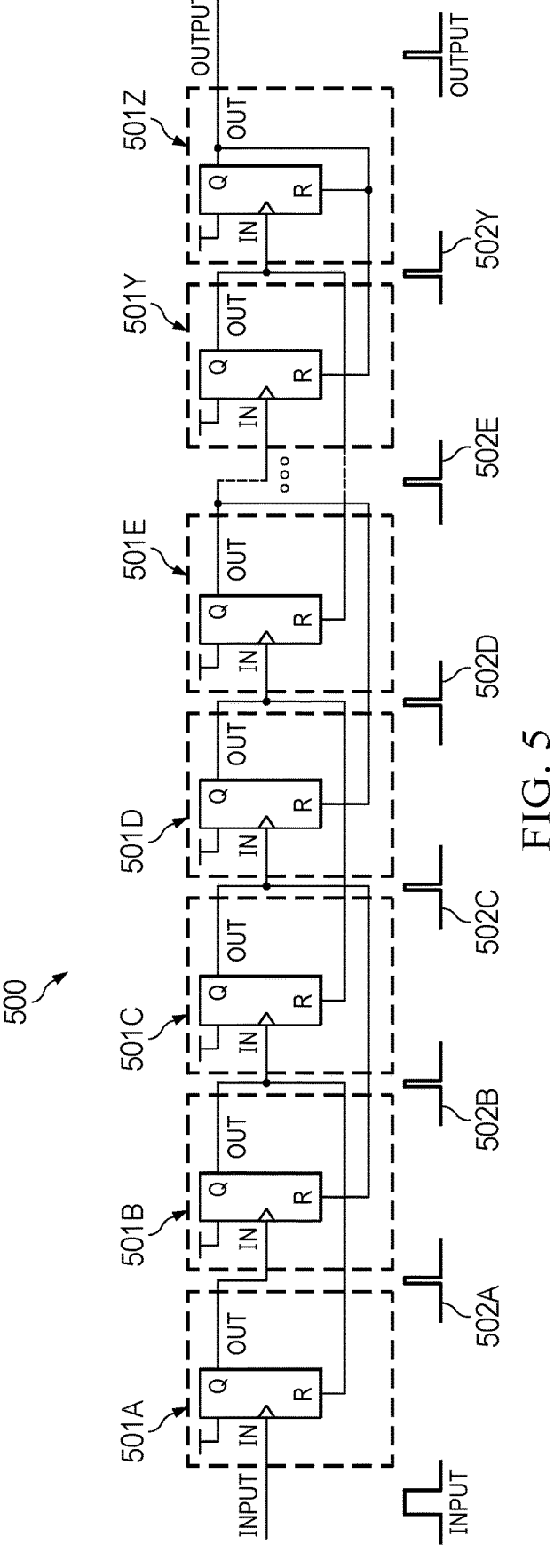
FIG. 5 is a diagram of an example of a flip-flop implementation of a sustainable delay line, according to some embodiments.

FIG. 5 is a diagram of an example of flip-flop implementation 500 of sustainable delay line 400, according to some embodiments. In this case, the output terminal of delay element 501B is coupled to the reset terminal of delay element 501A. The output terminal of delay element 501C is coupled to the reset terminal of delay element 501B, and so on.

The feedback loop between the output terminal of the next stage and the preceding stage ensures that each of full-pulse transitions 502A-Y is completed before the preceding stage is reset. In some cases, the width of each pulse 502A-Y may be equal to the sum of each of the flip-flop's internal C-to-Q and R-to-Q delays, and may be independently of the width of the INPUT signal.

With respect to any given one of delay elements 501A-Z, its output signal maintains at least a minimum pulse width in response to a pulse width of an input signal being smaller than a sum of: (i) a delay between its input terminal and its output terminal, and (ii) a delay between its reset terminal and its output terminal.

Figure 6:
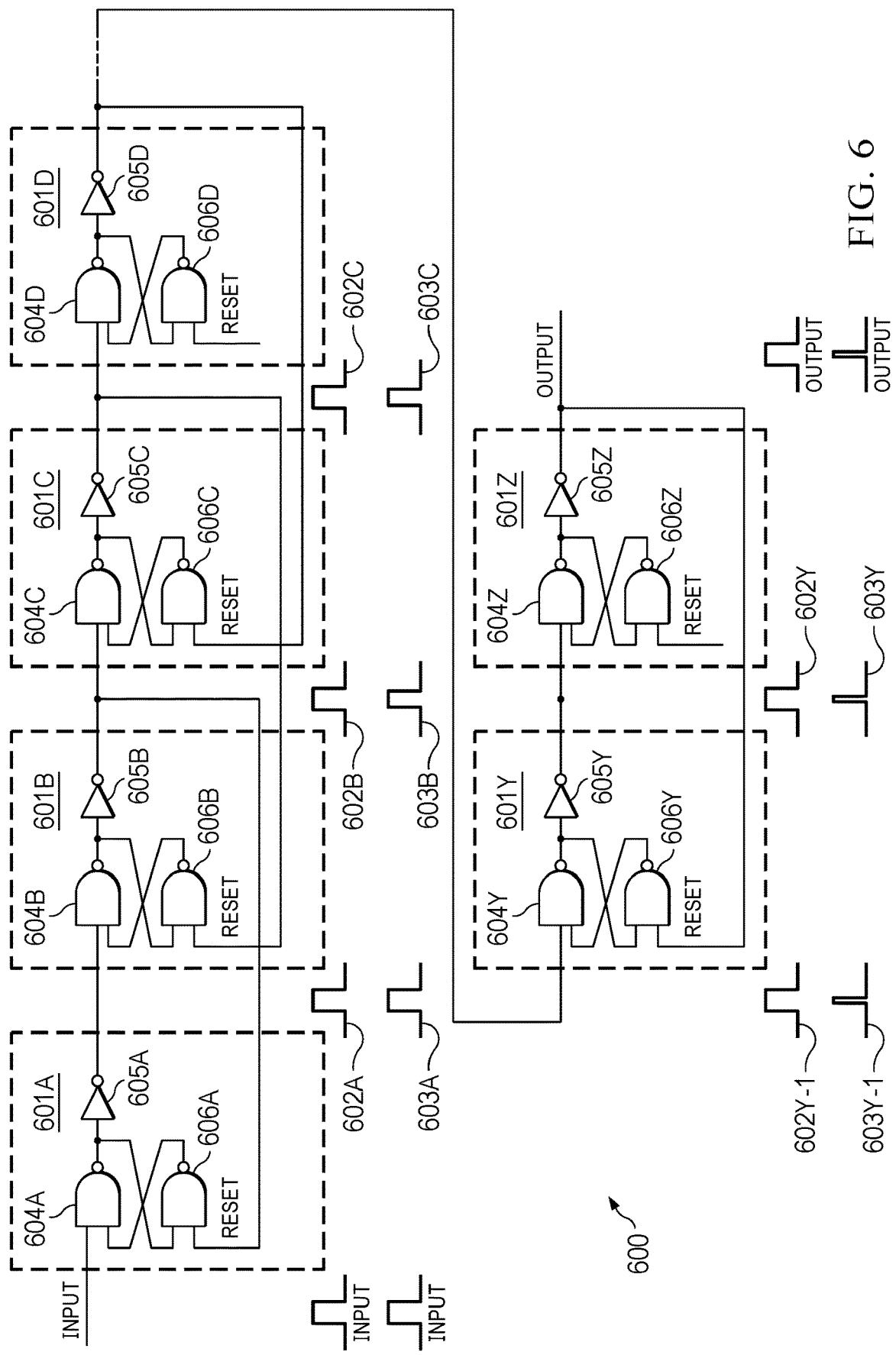
FIG. 6 is a diagram of an example of an inverter implementation of a sustainable delay line, according to some embodiments.

FIG. 6 is a diagram of an example of inverter implementation 600 of sustainable delay line 400, according to some embodiments. In this case, each of delay elements 601A-Z includes an inverter and a pair of logic gates (e.g., top and bottom) coupled together to form a resettable buffer or latch.

For example, top NAND gate 604C of stage 601C may include: a first input terminal configured to receive an input signal (e.g., from previous stage 601B), an output terminal coupled to inverter 605C, and a second input terminal coupled to an output terminal of bottom NAND gate 606C. Conversely, bottom NAND gate 606C may include: a first input terminal coupled to the output terminal of top NAND gate 604C, an output terminal coupled to the second input terminal of top NAND gate 604C, and a second input (or reset) terminal configured to receive a reset signal from subsequent stage 601D.

As with implementation 500, here the output terminal of delay element 601B is coupled to the reset terminal of delay element 601A. The output terminal of delay element 601C is coupled to the reset terminal of delay element 601B. The output terminal of delay element 601D is coupled to the reset terminal of delay element 601C, and so on.

If the duty cycle of the INPUT signal is greater than the minimum pulse width provided by each delay element 600A-Z, the OUTPUT signal of delay line 600 maintains the original duty cycle. However, if the duty cycle of the INPUT signal is smaller than the minimum pulse width provided by each delay element 600A-Z, the feedback loop between the output terminal of the next stage and the preceding stage ensures that each of pulse transitions 603A-Y is completed before the preceding stage is reset, thus guaranteeing that a signal propagating with the minimum pulse width reaches the end of sustainable delay line 600.

In an illustrative, non-limiting embodiment, a delay line may include: (i) a first delay element comprising: a first input terminal, a first output terminal, and a first reset terminal; and (ii) a second delay element comprising: a second input terminal coupled to the first output terminal, and a second output terminal coupled to the first reset terminal.

In some cases, the delay line may include at least 50 delay elements. In other cases, the delay line may include at least 100 delay elements. Additionally, or alternatively, the delay line may include at least 200 delay elements.

For example, the first and second delay elements may include D flip-flops. Additionally, or alternatively, the first and second delay elements may include inverters.

The first delay element may be configured to provide a first output signal at the first output terminal, and the first output signal may maintain at least a minimum pulse width in response to a duty cycle of an input signal received at the first input terminal being smaller than a sum of: (i) a delay between the first input terminal and the first output terminal, and (ii) a delay between the first reset terminal and the first output terminal.

Moreover, the delay line may further include a third delay element having a third input terminal coupled to the second output terminal and a third output terminal coupled to the second reset terminal.

In another illustrative, non-limiting embodiment, an SoC may include: a first circuit; a delay line coupled to the first circuit, where the delay line comprises a plurality of delay elements coupled in series, where each of the delay elements comprises an input terminal, an output terminal, and a reset terminal, and where an output terminal of a given delay element is coupled to a reset terminal of a preceding delay element; and a second circuit coupled to the delay line.

The first circuit may include a clock generator, and an input terminal of a first delay element among the plurality of delay elements is configured to receive a clock signal produced by the clock generator. For instance, the second circuit may include a processor core. Also, the delay line may be configured to maintain a minimum pulse width of a signal received from the first circuit in response to a duty cycle of the signal being smaller than a sum of: (i) a delay between an input terminal and an output terminal of a given delay element, and (ii) a delay between a reset terminal and the output terminal of the given delay element.

In yet another illustrative, non-limiting embodiment, in a delay line including a plurality of delay elements, a method may include coupling an input terminal of a delay element to an output terminal of a preceding delay element, and coupling an output terminal of the delay element to a reset terminal of the preceding delay element. The method may also include coupling an input terminal of a subsequent delay element to the output terminal of the delay element, and coupling an output terminal of the subsequent delay element to a reset terminal of the delay element.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, Internet-of-Things (IoT) devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

For sake of brevity, conventional techniques have not been described in detail herein. Furthermore, the connecting lines shown in the various figures contained herein have been intended to illustrate relationships (e.g., logical) or physical couplings (e.g., electrical) between the various elements. It should be noted, however, that alternative relationships and connections may be used in other embodiments. Moreover, circuitry described herein may be implemented either in silicon or another semiconductor material or alternatively by software code representation thereof.

Although the invention(s) are described herein with reference to specific embodiments, various modifications and changes can be made without departing from the scope of the present invention(s), as set forth in the claims below.

Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A delay line, comprising:
a first delay element comprising: a first input terminal, a first output terminal, and a first reset terminal; and
a second delay element comprising: a second input terminal coupled to the first output terminal, and a second output terminal coupled to the first reset terminal,
wherein the first delay element is configured to provide a first output signal at the first output terminal, and wherein the first output signal maintains at least a minimum pulse width in response to a duty cycle of an input signal received at the first input terminal being smaller than a sum of: (i) a delay between the first input terminal and the first output terminal, and (ii) a delay between the first reset terminal and the first output terminal.

2. The delay line of claim 1, wherein the delay line comprises at least 50 delay elements.

3. The delay line of claim 1, wherein the delay line comprises at least 100 delay elements.

4. The delay line of claim 1, wherein the delay line comprises at least 200 delay elements.

5. The delay line of claim 1, wherein the first and second delay elements comprise delay (D) flip-flops.

6. The delay line of claim 1, wherein the first and second delay elements comprise inverters.

7. The delay line of claim 1, further comprising:

a third delay element comprising: a third input terminal coupled to the second output terminal, and a third output terminal coupled to the second reset terminal.

8. A System-on-Chip (SoC), comprising:

a first circuit;

a delay line coupled to the first circuit, wherein the delay line comprises a plurality of delay elements coupled in series, wherein each of the delay elements comprises an input terminal, an output terminal, and a reset terminal, and wherein an output terminal of a given delay element is coupled to a reset terminal of a preceding delay element; and a second circuit coupled to the delay line, wherein the delay line is configured to maintain a minimum pulse width of a signal received from the first circuit in response to a duty cycle of the signal being smaller than a sum of: (i) a delay between an input terminal and an output terminal of a given delay element, and (ii) a delay between a reset terminal and the output terminal of the given delay element.

9. The SoC of claim 8, wherein the first circuit comprises a clock generator, and wherein an input terminal of a first delay element among the plurality of delay elements is configured to receive a clock signal produced by the clock generator.

10. The SoC of claim 8, wherein the second circuit comprises a processor core.

11. The SoC of claim 8, wherein the delay line comprises at least 100 delay elements.

12. The SoC of claim 8, wherein the delay line comprises at least 200 delay elements.

13. The SoC of claim 8, wherein each of the plurality of delay elements comprises a delay (D) flip-flop.

14. The SoC of claim 8, wherein each of the plurality of delay elements comprises an inverter.

15. In a delay line comprising a plurality of delay elements, a method comprising:

coupling an input terminal of a delay element to an output terminal of a preceding delay element; and coupling an output terminal of the delay element to a reset terminal of the preceding delay element, wherein the preceding delay element is configured to provide an output signal at an output terminal of the preceding delay element, and wherein the output signal maintains at least a minimum pulse width in response to a duty cycle of an input signal received at an input terminal of the preceding delay element being smaller than a sum of: (i) a delay between the input terminal of the preceding delay element and the output terminal of the preceding delay element, and (ii) a delay between the reset terminal and the output terminal of the preceding delay element.

16. The method of claim 15, further comprising:

coupling an input terminal of a subsequent delay element to the output terminal of the delay element; and coupling an output terminal of the subsequent delay element to a reset terminal of the delay element.

17. The method of claim 15, wherein the delay elements comprise delay (D) flip-flops.

18. The method of claim 15, wherein the delay elements comprise inverters.

* * * * *